United States Patent [19]
Hawkswell

[11] Patent Number: 4,756,073
[45] Date of Patent: Jul. 12, 1988

[54] MACHINES FOR HANDLING ELECTRICAL COMPONENTS

[75] Inventor: Victor T. Hawkswell, Witham, England

[73] Assignee: USM Corporation, Farmington, Conn.

[21] Appl. No.: 866,041

[22] Filed: May 22, 1986

[30] Foreign Application Priority Data

May 28, 1985 [GB] United Kingdom ............... 8513296

[51] Int. Cl.$^4$ ............................................. H01R 43/00
[52] U.S. Cl. .................................. 29/564.6; 29/33 M; 29/566.2
[58] Field of Search ................ 29/564.1, 564.4, 564.6, 29/564.7, 564.8, 566.2, 741, 748, 749, 751, 753, 33 M

[56] References Cited

U.S. PATENT DOCUMENTS

| | | | |
|---|---|---|---|
| 3,597,824 | 8/1971 | Yoshida et al. | 29/564.6 X |
| 4,293,999 | 10/1981 | Woodman, Sr. | 29/564.6 |
| 4,313,251 | 2/1982 | Asai et al. | 29/564.6 |
| 4,403,723 | 9/1983 | Dean et al. | 29/564.6 X |
| 4,631,800 | 12/1986 | Ishii et al. | 29/566.2 X |

Primary Examiner—Z. R. Bilinsky
Attorney, Agent, or Firm—Spencer T. Smith

[57] ABSTRACT

It is convenient to supply electrical or electronic components for placement on tapes; however it has proved difficult to satisfactorily handle tapes for carrying large components. Use of wide tapes to feed larger components is facilitated by using a drive belt (48) to rotate at a sprocket wheel (44) to feed the tape (38,40), a drive wheel (52) to move the belt, and drive means conveniently a ratchet wheel to cause the drive wheel (52) to rotate through a predetermined angle to feed the tape a distance equal to the spacing between the components on the tape. Wide tape can conveniently be disposed of after unloading by using means (88,90) for severing the tape (38) immediately downstream of an unloading position, and means for collecting the severed tape preferably comprising a duct (84) through which a current of air flows to carry the severed tape to a remote receptacle (85).

6 Claims, 2 Drawing Sheets

Fig_1

MACHINES FOR HANDLING ELECTRICAL COMPONENTS

FIELD OF THE INVENTION

This invention is concerned with machines for handling electrical or electronic components (e.g. so called flat-packs) supplied at spaced intervals on a tape, especially such machines for placing the components on a substrate, for example a printed circuit board.

SUMMARY OF THE PRIOR ART

Various ways of supplying electrical components to machines for handling the components, for example component placing machines, are known. One such known method of supply is to mount the components at regularly spaced intervals on a suitable tape which is reeled up on a suitable reel which can be mounted in the machine: the tape is progressively unwound from the reel and the components removed one at a time from the tape for use. In one such tape supply system each component is positioned in a pocket on the tape, the pockets being spaced regularly one from the next. Commonly, the components are retained in the pockets by a cover tape lightly adhered to the surface of the carrying tape so that, when the components come to be removed, the cover tape can be readily stripped from the carrier tape to expose the components for removal. Until recently the use of such pocketed tapes has been restricted to the supply of relatively small components and the carrier tape which has been used has been very flexible. Commonly, the tape is fed forwardly to expose one component at a time, successively, at an unloading position where the component is removed from the tape by a suitable means, the tape from which the components have been removed being curved generally back on itself and fed to a scrap bin disposed beneath the tape magazine, at the entrance to which bin the used tape is chopped into small pieces so that the used tape can be more readily disposed of.

It will be appreciated that, in many machines for handling electrical components, it is only possible to feed the tape linearly beyond the position at which components are unloaded from the tape for a very short distance because the empty tape would foul other instrumentalities of the machine.

Recently it has been proposed to supply larger components in pocketed tape. In order to effectively carry such larger components it has proved necessary to use a stronger, and less flexible, carrier tape: for example, one such tape for these larger components is approximately 45 mm in width and has pockets which may be about 25 mm square and spaced at about 32 mm centres, and about 5 mm in depth, such tape being made by a forming operation from a fairly stiff plastics sheet. It has been proved possible to curve this more rigid tape back on itself through a necessary angle in order to utilise the previously known system for disposing of the carrier tape without impeding the operation of the machine unacceptably.

OBJECTS OF THE INVENTION

One of the various objects of the present invention is to provide an improved machine for handling electronic components of a relatively large size supplied on a tape.

Another of the objects of the present invention is to provide a machine facilitating the use of relatively rigid tape on which electronic components are supplied.

SUMMARY OF THE INVENTION

A machine for handling electrical or electronic components supplied at spaced intervals on a tape embodying the invention comprises means for feeding the tape carrying electrical components spaced apart at intervals to present components successively at an unloading position. The machine comprises means, eg a component placement head preferably including a vacuum pick-up tool, for unloading a component from the tape at the unloading position. The machine further comprises means for severing the tape immediately downstream of the unloading position to separate the tape from which components have been unloaded from the remainder of the tape. The means for severing the tape conveniently comprises shears operated by a pneumatic piston and cylinder arrangement. The shears preferably are mounted on a frame of the machine immediately downstream of the unloading position but alternately the severing means may be mounted for movement between the severing position and a position remote therefrom, for example where the use of severing means mounted in a fixed position would interfere with the operation of other parts of the machine. The machine further comprises means for collecting the severed tape preferably in the form of a chamber provided by a duct through which a current of air flows, in the operation of the machine, the leading end of a tape which is to be severed projecting into the duct so that when the tape is severed, the severed piece of tape is within the chamber and carried by the current of air to a remote receptacle for collection. Whereas the machine comprises a duct in which an air current flows alternately other means may be provided to removed the severed pieces of tape, for example a small belt conveyor.

The preferred machine in fact comprises a tape supply magazine for supporting a reel about which is wound the tape carry electrical components. The means for feeding the tape is mounted on the tape supply magazine and comprises a sprocket wheel having regularly spaced sprocket pins engaging regularly spaced sprocket holes in tape unwound from the reel, a drive belt arranged to rotate the sprocket wheel to feed the tape in the operation of the machine, a drive wheel arranged to move the belt to rotate the sprocket wheel in the operation of the machine, and drive means to cause the drive wheel to rotate through a predetermined angle in the operation of the machine to thereby feed the tape a predetermined distance equal to the distance by which the components are spaced apart on the tape.

DESCRIPTION OF THE PREFERRED EMBODIMENT

Figure 3:
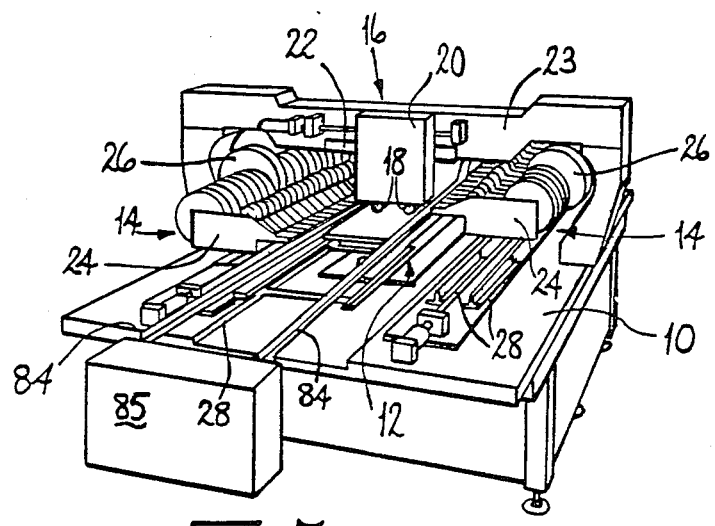
FIG. 3 is a perspective view of the illustrative machine.

A machine for handling electrical or electronic components, namely a machine for placing components on a substrate, for example, a printed circuit board, is shown in FIG. 3. This machine comprises a frame 10 on which is mounted for movement a so-called X-Y table 12, two component supply means 14, one mounted at either side of the X-Y table and component placing means 16. One such machine is supplied by the applicant company and is designated MPS500. The whole of this illustrative machine is controlled by suitable computer means (not shown) of the machine. The X-Y table is constructed to support thereon a suitable substrate (or substrates) on which electronic components are to be placed in a precisely known location. The X-Y table is operated, in the operation of the machine, by the computer means, to move any preselected point on the substrate into register with a placement position.

The component placing means 16 comprises two component placement heads 18 mounted on a carriage 20, the carriage being movable on a rail 22 transversely of the machine whereby to move each of the placement heads between the aforementioned placement position and a component supply position at which each head may pick-up a component from the associated one of the component supply means 14. The rail 22 is mounted on a bridge member 23 of the frame 10 so that the component placement heads 18 are supported above the X-Y table 12.

Each of the component supply means 14 comprises a carriage 24 on which are located a plurality of tape supply magazines 26. Each of the component supply carriages is mounted for movement on parallel rails 28 lengthwise of the illustrative machine under the control of the computer means.

Each of the tape supply magazines 26 comprises frame means 30 which is mounted on the carriage 24 in a known position so that a component at a pick-up station 32 of the magazine 26 is presented in a known component supply (or unloading) position in the operation of the illustrative machine. An axle 34 is fixed to the frame means 30 and carries, for rotation thereabout, an exchangeable tape reel 36. Wound round the tape reel 36 is a component supply tape system comprising a carrying tape 38 by which electrical components are carried spaced apart at regular intervals and a cover tape 40, lightly adherent to the carrying tape 38 and which can be readily stripped off to expose components to be unloaded in the operation of the machine. The carrying tape 38 comprises a plurality of regularly spaced pockets 42 in which the components are carried. The tape assembly is 45 mm wide and the pockets may extend substantially across the width of the tape, merely leaving a narrow margin at each side in at least one of which margins are provided a row of regularly spaced sprocket holes. The pockets 42 are conveniently dimensioned so that the electrical component to be supplied is a fairly close fit in the pocket thereby ensuring that the spacing apart of successive components is substantially regular. In view of the fact that the electrical components to be supplied in the carrying tape 38 are quite large, it is necessary for the carrying tape 38 to be sufficiently strong and rigid to satisfactorily hold the components while yet having a degree of flexibility sufficient to permit the tape to be wound round the tape reel 36. Conveniently the carrying tape 38 may be moulded from a suitable strip of fairly stiff plastics material. The cover tape 40, on the other hand, is provided by a strip of very much more flimsy and flexible plastics material which is, as hereinbefore mentioned, lightly adherent to the carrying tape 38, covering the openings in the pockets 42 thereby retaining components in the pockets 42.

The tape supply magazine further comprises a sprocket wheel 46 mounted for rotation about an axle 44 parallel with the axle 34, near to the pick-up station 32 of the magazine 26. Tape unwound from the reel 36 is fed transversely of the illustrative machine by engagement of sprocket pins of the sprocket wheel 46 in the sprocket holes of the tape assembly 38,40. The sprocket wheel 46 is arranged to be driven by a toothed drive belt 48, the teeth of the drive belt engaging complementary recesses in the sprocket wheel whereby to positively drive the sprocket wheel 46. The drive belt 48 passes round two idler wheels 50 and a drive wheel 52, each mounted for rotation about axes parallel with the axles 34, 44. The teeth of the drive belt 48 engage in complementary recesses in the drive wheel 52 so that rotation of the drive wheel 52 positively drives the drive belt 48 and thus the sprocket wheel 46. The position of the idler wheel 50 may be adjusted slightly to correctly tension the drive belt 48; for example, the axle of the idler wheel 50 may be mounted in an eccentric mounted on the frame means 30 of the magazine 26 so that by rotation of the eccentric mounting the position of the axle of the idler wheel 50 relative to the wheels 46,51,52 may be slightly adjusted, the eccentric mounting means being arranged to be locked in its adjusted position to maintain the desired tension in the drive belt 48.

The illustrative machine further comprises drive means so constructed and arranged as to cause the drive wheel 52 to rotate through a predetermined angle of revolution in the operation of the machine to thereby feed the tape assembly 38,40 a predetermined distance equal to the distance by which the pockets 42 (and thus the components in the pockets) are spaced apart on the carrying tape 38. The drive means comprises a ratchet wheel (not visible in the drawings) mounted for rotation about the axis of the drive wheel 52 whereby the drive wheel 52 is rotated when the ratchet wheel is rotated.

A spring member 56 is engageable with the ratchet wheel to prevent the ratchet reel rotating in a direction opposite to the feed direction. A lever 58 is mounted for movement through a predetermined arc from an initial position about the axis of the drive wheel 52 in a first direction in which a pawl 54 carried by the lever 58 engages the ratchet wheel and causes the ratchet wheel (and thereby the drive wheel 52) to rotate and thus feed the tape said predetermined distance, and a second direction opposite the first direction in which the lever 58 is returned to its initial position without rotating the ratchet wheel. The lever 58 is arranged to be moved through said arc by an operating arm 60 mounted for pivotal movement about a pivot pin 62 carried by the frame means 30. An end portion 64 of the operating arm 60 projects beyond the frame means 30 for a purpose which will be explained hereinafter.

The tape assembly 38,40 unwound from the reel 36 is guided by a guide plate 66 of the frame means 30 and supported by a trough-like support 67 of the frame means 30 as it is fed towards the pick-up station 32. A stripper plate 68 overlies the cover tape slightly upstream of the pick-up position and the cover tape 40 is stripped off around the stripper plate. The cover tape 40 is reeled up on a take-up reel 70 mounted for rotation on an axle 72 parallel with the axles 34,44. A pulley 74 is integral with the take-up wheel 70 and is engaged by a drive belt 76 driven by a drive pulley 78 comprising a tired wheel portion. The tired wheel portion of the pulley 78 is spring urged towards a back-up roll 80 mounted for rotation about a support axle fixed in the frame means 30 with the tape assembly 38,40 passing between the tired portion of the pulley 78 and the back up roll 80. Thus feed movement of the tape assembly 38, 40 is effective to rotate the pulley 78, thus driving the take-up reel 70 and tensioning the cover tape 40. The tension applied to the cover tape 40 around the stripper plate 68 is sufficient to peel the cover tape 40 from the carrying tape 38, exposing the components in the pockets 42 for removal from the tape when the pockets reach the pick-up station 32. The gearing of the pulleys 78,74 is such that the take-up reel 70 always tends to reel up the cover tape 40 faster than the tape assembly 38,40 is being fed towards the pick-up station: the tired portion of the drive pulley 78 slips on the cover tape thus ensuring that adequate tension is applied to the cover tape 40 without damaging the tape or the tape supply magazine.

As hereinbefore mentioned a plurality of tape supply magazines 26 is mounted on the carriage 24 of the component supply means 14. Each tape supply magazine 26 is mounted in a predetermined position so that the pick-up station 32 of each magazine 26 can be presented at the unloading position by movement of the carriage 24 along the rails 28. The location of each magazine 26 on the carriage 24 is supplied to the computer means of the illustrative machine so that the carriage can be moved under the control of the computer means to present a magazine 26 carrying a desired component with its pick-up station 32 at the unloading position. When the appropriate magazine 26 is presented with its pick-up station at the unloading position the adjacent one of the heads 18 is moved into register with the unloading position by movement of the carriage 20 along its rail. A pick-up tool of the placement head 18 is then caused to descend under the control of the computer means into contact with the component at the unloading position and the component lifted from its pocket in known manner; conveniently vacuum is applied to the pick-up tool to hold the component against the pick-up tool and the components can then be lifted and oriented by means of orienting jaws 82 in known manner. When one of the heads 18 is in register with its associated unloading position the other of the heads is at the component placement position and is able to place a previously picked-up component on a desired part of a substrate carried by the X-Y table 12 which will have been moved under the control of the computer means to carry a desired position of the substrate into register with the component placement position. Means, including the placement heads 18, are therefore provided in the illustrative machine for unloading a component from the tape at the unloading position.

Figure 2:
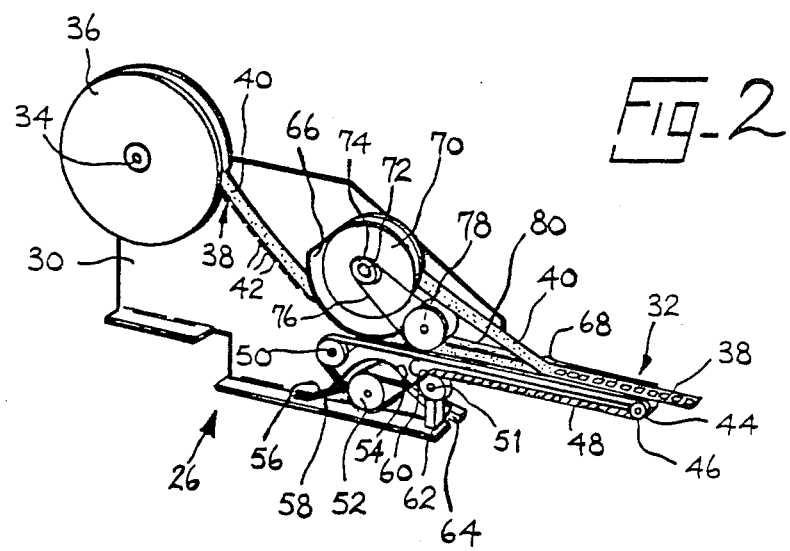
FIG. 2 is a perspective view of a tape supply magazine of the illustrative machine, for handling electrical components.

Each of the carriages 24 is moved to present the pick-up station 32 of the magazine from which it is next desired to pick-up a component at the unloading position whilst the associated one of the placement heads 18 is placing a component which it previously picked-up from the unloading position. When the carriage 24 has stopped with the pick-up station 32 of the appropriate one of the magazines 26 at the unloading position a piston and cylinder arrangement (not shown) mounted on the frame 10 of the illustrative machine is actuated by the computer means to extend the piston rod into engagement with the projecting end portion 64 of the operating arm 60 whereby to pivot the arm 60 about the pivot pin 62, thereby moving the operating lever 58 to rotate the ratchet wheel and thus the drive wheel 52, thereby to index the tape assembly 38,40 through a feed step and present a pocket 42 carrying a component, at the pick-up station 32. The diameter of the drive wheel 52 of the tape supply magazine 26 is selected according to the predetermined distance through which it is desired to feed the tape. The arc through which the operating lever 58 of the drive means swings is determined by the rotation of the operating arm 60. The angle through which the operating arm 60 rotates is determined by the stroke of the piston and cylinder arrangement mounted on the machine frame 10 by which the operating arm 60 is moved. The operating lever 58 and the operating arm 60 are returned to their initial positions in which they are shown in FIG. 2 of the drawings by spring means (not shown); the operating lever 58 is likewise maintained in engagement with the operating arm 60 by spring means (not shown) so that the operating instrumentalities are maintained in the desired position with substantially no play. Thus, by choosing a magazine 26 having a drive wheel 52 of appropriate diameter a feed stroke from the piston and cylinder arrangement of fixed length may be used to index the tape of each tape supply magazine 26 through an indexing step of length appropriate to the tape on the particular magazine in question.

Heretofore, indexing has been carried out in a variety of ways, a preferred method from many points of view being the use of a single piston and cylinder arrangement mounted on the frame. However such heretofore used arrangements have operated a ratchet wheel to drive the tape-driving sprocket wheel directly. Because of the short stroke needed to index tapes carrying small components, for example chips, such heretofore known indexing means have required several strokes of the piston in order to ratchet the sprocket wheel through a sufficient rotation to index the tapes sufficiently when feeding larger components. Such repeated operations of the piston and cylinder to effect a sufficient feed of the tape to move a wide tape carrying a large component sufficiently to carry the component to the pick-up station have significantly slowed the operation of the machine, thus reducing the number of components which can be placed in a given period of time and thereby reducing the efficiency of the machine when handling large components by a tape supply magazine method. The use of the tape supply magazine according to the invention permits magazines carrying tapes, each tape with a different interval between adjacent components to be indexed by a single, fixed-length, stroke of the piston and cylinder arrangement so that the efficiency of the machine remains the same whether small or large components are supplied.

Use of a small diameter sprocket wheel to feed the tape, adjacent the pick-up station 32, is desirable in order to keep the magazine adjacent the pick-up station 32 compact thus leaving the maximum freedom of movement to the placement head 18 and X-Y table 12 without fouling the magazine adjacent the pick-up station.

Indexing of the tape moves the leading end of the tape which consists of an empty pocket 42 from which a component was removed in a previous cycle of the illustrative machine so that it projects beyond the end of the magazine 26 into a chamber of means for collecting the tape. The chamber is provided by a duct 84 mounted on a bracket 86 fixed to the bridge member 23 and projecting downwardly therefrom. The duct 84 extends parallel with the rails 28 towards an end portion of the frame 10 above the level of any substrate carried on the X-Y table but clear of the placement head 18, tape supply magazines 26 and carriage 24. The leading end portion of the carrying tape 38 passes between cutting edges 88, one such edge being provided on a face of the duct 84 and the other being provided on a cutting arm 90 mounted for pivotal movement on the bracket 86. A piston rod 92 of a piston and cylinder arrangement is pivotally connected to an end portion of the cutting arm 90 remote from its cutting edge. A cylinder 94 of the piston and cylinder arrangement is pivotted on the bracket 86. Thus when operating fluid is introduced at one end or the other of the cylinder 94 the piston rod 92 is either extended from or retracted into the cylinder 94 causing the cutting arm to pivot about its pivot 96; the operating fluid in the illustrative machine is conveniently air.

Figure 1:
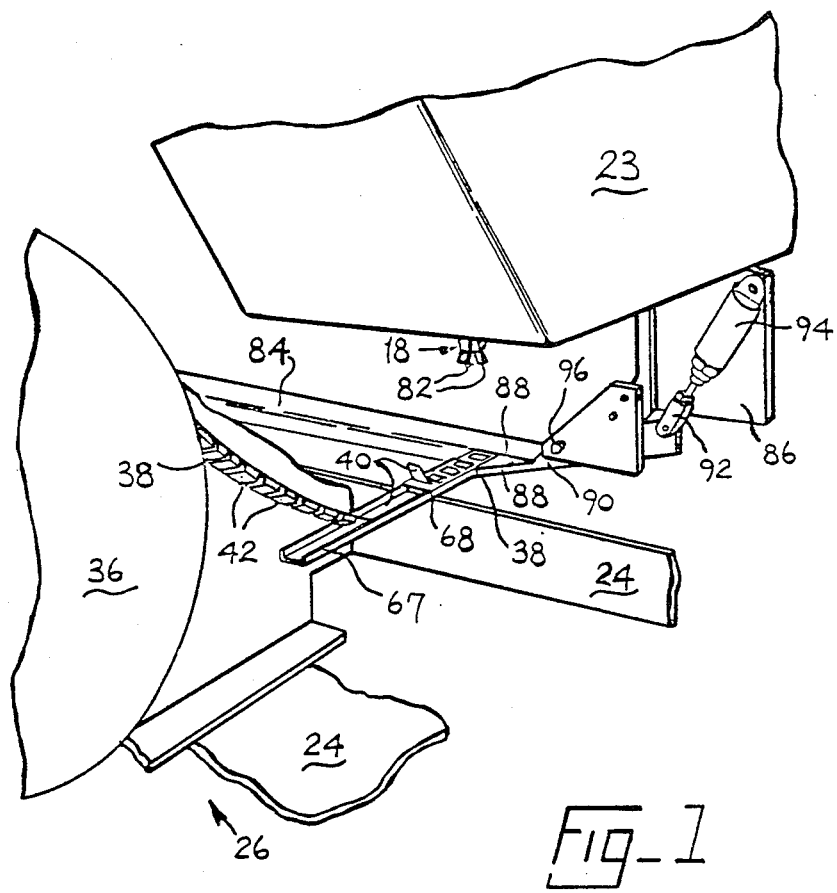
FIG. 1 is a perspective view, with parts broken away of a machine for handling electrical components embodying the invention showing means for severing a tape.

Thus, when the tape of a magazine with its pick-up station 32 at the unloading position has been indexed to present a new component at the pick-up station the piston 94 is operated to pivot the cutting arm 90 in a clockwise direction viewing FIG. 1 from its rest position (in which it is shown in FIG. 1) to sever the leading end portion of the tape 38 by means of the cooperating cutting edges 88.

An air current is present in the duct 84, flowing from the region of the cutting edges 88 towards a collecting receptacle 85 at the end of the machine frame 10. The severed piece of tape (which it will be recalled projects into the duct 84) will be carried by this air current along the duct 84 and deposited in the receptacle. The air current in the duct 84 is provided by applying a vacuum at the end portion of the duct remote from the cutting edges 88. However, the air current may alternatively be provided by applying air under pressure at the end portion of the duct 84 adjacent the cutting edges 88 provided that the air current in effective to propel the severed piece of tape along the duct towards the collecting receptacle 85; however application of air under pressure in this region will necessitate suitable air connections and supply adjacent the cutting edges 88 in a part of the machine which is already congested by the presence of the tape feed magazine and, during picking-up of a component, by the associated one of the placement heads 18 and use of suction applied remote from the cutting edges is therefore preferred. Whereas in the illustrative machine a shearing action is effected by the cutting edges 88 to sever the tape other means for severing the tape, for example a guillotine may be provided for severing the tape immediately downstream of the unloading position thus to separate tape from which components have been unloaded from the remainder of the tape 38.

The means for severing the tape and the duct 84 are relatively compact and occupy little space in a critical region of the illustrative machine at which it would be impossible to site a suitable collection receptacle for severed pieces of tape or indeed for reeling up the used tape were this to be contemplated. The radius at which carrying tape 38 with large pockets for larger components can be curved is too great for the tape to be curved back on itself and directed into a scrap bin beneath the machine without fouling other integers of the machine, notably the X-Y table 12. Positioning of the collecting receptacle 85 at the end of the machine frame 10 renders it readily accessible to the operator for emptying whilst keeping the bulky receptacle clear of the operational area of the machine. Whereas in the illustrative machine the severed leading end of the tape 38 is carried away by a current of air flowing along the duct 84, other conveying means may be used to remove the tape, for example a conveyor belt housed in a suitable housing; however the air duct of the illustrative machine is preferred.

I claim:

1. A machine for handling electrical or electronic components supplied at spaced intervals in pockets defined in a continuous carrying tape comprising:

means for horizontally feeding the carrying tape to present components contained in the pockets successively at an unloading position and to simultaneously horizontally advance the carrying tape portion including an empty pocket away from the unloading position, means for unloading a component from a carrying tape pocket located at the unloading position, means for transversely severing the carrying tape across the portion of the tape between successive pockets to separate a carrying tape portion having an empty pocket from the remainder of the carrying tape, elongated duct means, means for supporting said duct means so that it extends transversely of the carrying tape and so that the portion of the carrying tape to be severed will be located therein, and means for blowing air through said duct means for carrying severed portions of the carrying tape horizontally along said duct means to the end thereof.

2. A machine according to claims 1 in which the means for severing the tape comprises shears.

3. A machine according to claim 2 wherein said severing means further comprises a piston and cylinder arrangement for operating said shears.

4. A machine according to claim 1 wherein the means for feeding the tape comprises a tape supply magazine for supporting a reel about which is wound a tape carrying electrical components spaced apart by regular intervals, a sprocket wheel having regularly spaced sprocket pins engaging regularly spaced sprocket holes in the tape (unwound from the reel), a drive belt arranged to rotate the sprocket wheel to feed the tape in the operation of the machine, a drive wheel arranged to move the belt to rotate the sprocket wheel in the operation of the machine, and drive means to cause the drive wheel to rotate through a predetermined angle in the operation of the machine to thereby feed the tape a predetermined distance equal to the distance by which the components are spaced apart on the tape.

5. A machine according to claim 4 wherein the carrying tape includes a cover tape further comprising:

means for stripping the cover tape from the carrying tape before the carrying tape reaches said unloading position, and a take-up reel for receiving the cover tape stripped from the tape carrying components.

6. A machine according to claim 5 wherein the take-up reel is driven by a wheel which engages the tapes before the cover tape is stripped off and is rotated by the feeding movement of the tapes.

* * * * *